(12) United States Patent
Hsu et al.

(10) Patent No.: US 6,628,548 B1
(45) Date of Patent: Sep. 30, 2003

(54) FLASH MEMORY WITH ACCELERATED TRANSIENT STATE TRANSITIONS

(75) Inventors: Yu-Ming Hsu, Hsin-Chu (TW); Ling-Chang Hu, Chang-Hua Hsien (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 10/248,044

(22) Filed: Dec. 12, 2002

(30) Foreign Application Priority Data

Apr. 11, 2002 (TW) ........................................ 91107377 A

(51) Int. Cl.[7] .............................. G11C 16/06; G11C 7/02
(52) U.S. Cl. .................... 365/185.21; 365/201; 365/210
(58) Field of Search ........................ 365/185.21, 189.07, 365/189.09, 196, 207, 210

(56) References Cited

U.S. PATENT DOCUMENTS 6,055,187 A * 4/2000 Dallabora et al. ...... 365/185.21

2003/0002342 A1 * 1/2003 Srinivasan et al. .... 365/185.21

* cited by examiner

Primary Examiner—Thong Le
(74) Attorney, Agent, or Firm—Winston Hsu

(57) ABSTRACT

A non-volatile memory unit includes memory units for providing a data current corresponding to stored data; a first load unit having a first end; a second load unit having a second end; and a sensing unit. The first load unit and the second load unit can receive current input to build voltages respectively at the first end and the second end. When the memory unit provides the data current, the second load unit is enabled such that the data current inputs into the first load unit and the second load unit; then the second load is disabled after a predetermined time such that the data current inputs into the first load unit only, and the sensing unit generates a data signal for data-acquisition according to a voltage difference between the voltage at the first end and a reference voltage.

18 Claims, 9 Drawing Sheets

FLASH MEMORY WITH ACCELERATED TRANSIENT STATE TRANSITIONS

BACKGROUND OF INVENTION

1. Field of the Invention

The present invention relates to non-volatile memory, and more particularly, to a non-volatile memory that utilizes extra devices to accelerate transient state transitions, and disables extra load units to maintain the sensitivity of operating margins when reading data.

2. Description of the Prior Art

The growth of the so-called information age has led to the storage of mass quantities of information in digital form. Memory storage devices are thus an important topic of research and develop. Flash memory has become prevalent, allowing the access of data at speeds comparable to those of other forms of electronic memory, while storing digital data in a non-volatile manner without requiring any moving parts. Flash memory has thus become one of the most important types of non-volatile storage devices.

Please refer to FIG. 1, which is a circuit diagram of a prior art flash memory 10. The flash memory 10 is biased by DC current $V_{dd}$, and has a plurality of memory units 11A and 11B, two on-load isolating units 12A and 12B, a sensor unit SA1, two p-type MOS transistors Ta1 and Ta3 for load units, and a p-type MOS Ta7 for reference units. In memory units 11A and 11B, MOS transistors Ma1 and Ma2 have floating gates to store data. The gates of MOS transistors Ma1, Ma2, TA1 and TA2 are controlled by the controlling voltage $V_{ma1}$, $V_{ma2}$, $V_{d1}$ and $V_{d2}$ respectively to determine whether the MOS is on or off. The MOS transistor TA1 of the memory unit 11A is also electrically connected to one end of the MOS transistor Ma1; the other end serves as a data end, and is electrically connected with on-load isolating at the node Na5. Similarly, an end of MOS transistor TA2 of the memory 11B is electrically connected with the node Na5, and serves as a data end of the memory unit 11B. On-load isolating units 12A and 12B utilize inverters Iva1, Iva2 and p-type MOS transistors Ta5, Ta6, respectively. The p-type MOS transistors serve as a loading unit, connecting to provide negative feedback, of which the source electrode is connected to the node Na1 with the load unit 12A, and the drain electrode is grounded. The source electrode of the MOS transistor Ta3, serving as a third end, connects with the on-load isolating unit 12B at the node Na3, and its drain electrode is grounded. The sensor unit SA1 is a differential sensing amplifier, comprising a first comparing end N1a and a second comparing end N2a, which are connected respectively to the nodes Na1 and Na3; the sensor unit SA1 compares the first comparing end N1a to the second comparing end N2a, and then generate a data signal $V_{rp1}$. The MOS transistor Ta7 with a floating gate electrode serves as a reference unit, of which its gate electrode is controlled by the controlling-voltage $V_{ca}$; one of the other two electrodes is connected to the power $V_{dd}$, and the other is connected to the node Na6 with the on-load isolating unit 12B.

The principle of operation for storing data into flash memory is to store each bit to one of the memory units that contains transistors with floating gates. Programming a bit into a memory unit, represented by a binary "0" or a binary "1" is performed by injecting differing amounts of electric charge. The floating-gate electrode is injected with a different amount of electric charge, which changes the threshold voltage. Even when under the same condition of voltage bias, the different amount of electric charge in the floating-gate results in a different conductance of the MOS transistor, and thus different amounts of data current. Accordingly, it is possible to read out the data stored in the floating-gates of all the memory units. As shown in the FIG. 1, when the memory 10 is to read the binary data stored in the memory unit 11A, the memory 10 controls the controlling-voltage $V_{ma1}$ to bias and turn on the MOS transistor Ma1 from the gate electrode, and the MOS transistor Ma1 then generates a data current If1. The memory 10 also turns on the MOS transistor TA1 by a high-voltage level $V_{d1}$, so that the data current $I_{f1}$ can flow through the MOS transistor TA1 via the node Na5. Of course, the MOS transistor TA2 of the memory unit 11B is turned off by the controlling-voltage $V_{d2}$, which prevents the memory 11B from outputting data current $I_{f1}$ to the node Na5, and thus prevents interfere when reading the data from the memory unit 11A. The on-load insolating unit 12A transmits data current $I_{f1}$ to the node Na1, and injects the current $I_{f1}$ into the MOS transistor Ta1, which is the load unit. With the MOS transistor Ta1 current-biased by this data current $I_{f1}$, the MOS transistor Ta1 establishes a corresponding voltage at the node Na1. When the MOS transistor Ta1 is turned on, the controlling-voltage $V_{ca}$ turns on the MOS transistor Ta7, which also serves as a reference unit, making the MOS transistor Ta7 generate a reference current $I_{r1}$, and injecting the current $I_{r1}$ into the MOS transistor Ta3. Serving as the load unit, after the MOS transistor Ta3 is biased with this reference current $I_{r1}$, the MOS transistor Ta3 generates a corresponding voltage at the node Na3. The sensor unit SA1 compares the voltage at Na1 with the voltage at Na3 through the first comparing end N1a and the second comparing end N2a, and generate a corresponding data signal $V_{rp1}$, which reads out the data in the memory unit 11A.

The process of reading data is further illustrated in FIG. 2. Please refer to FIG. 2 and FIG. 3. FIG. 2 is a graph of voltage versus time at first comparing end N1a and the second comparing end N2a when the memory 10 is in process of reading data; the X-axis represents time, and the Y-axis represents the voltage; the curves V(N1a)H and V(N1a)L represent voltage at the first comparing end N1a varying with time, whereas the curve V(N2a) represents the voltage at the second comparing end N2a. Before the timing point ta0, the memory 10 has not yet read the data, and the first and the second comparing ends, N1a and N2a, are charged to high-voltage levels. When the time reaches ta0, the MOS transistors Ma1 and Ta7 generate current, and pull down the voltages of the first comparing end Na1 and the second comparing end Na2. As mentioned above, differing amounts of electric charge stored in the floating gate of the MOS transistor Ma1 in the memory unit 11A results in a different data current $I_{f1}$. When the data current $I_{f1}$ is greater (indicating a lower threshold voltage), the voltage of the first comparing end N1a will have the shape of V(N1a)H, and eventually falls to a higher steady-state voltage $V_{aH}$; on the other hand, when the data current $I_{f2}$ is smaller, the voltage of the first comparing end N1a will follow curve V(N1a)L, and eventually falls to a lower steady-state voltage $V_{aL}$. Similarly, the voltage of the second comparing end N2a falls to a steady-state voltage $V_{aR}$. During the interval between ta0 and ta2, the inverters Iva1 and Iva2 in the on-load isolating units 12A and 12B respectively and adequately bias the MOS transistors Ta5 and Ta6, which lightens the load-effect occurring at the nodes Na1 and Na3 to accelerate the speed at which a steady-state is reached. When the voltages of the two comparing-ends N1a, N2a have reached their respective steady-state voltages, the sensor-unit SA1 determines what data is stored in the memory 11A by detecting the voltage difference between the two comparing ends N1a, n2a. When the voltage of the first comparing end N1a is greater than that of the second comparing end N2a, the electric charge stored in the MOS transistor Ma1 corresponds to a greater data current. The sensor unit SA1 thus decides if the data stored in the memory unit 11A is a binary "0" or a binary "1", and accordingly generates a data signal $V_{rp1}$.

It's common to utilize many memory units in an ordinary flash memory, and connect them to the node Na1 through relatively long metal paths. A large capacitance is consequently formed at the node Na1. Decreasing the voltage of the node Na1 to a steady state merely by way of the data current of a memory unit is quite slow. One drawback of the prior art memory 10 is that the process of reading data is easily affected by transient states, or discharging. As shown in FIG. 2, if the sensor unit SA1 incorrectly compares the voltages at the timing-point ta1, regardless of the data current flowing out of the memory unit 11A is great or small, the sensor unit SA1 will erroneously decide that data is stored in the memory unit 11A, since the voltage of the first comparing end N1a is definitely greater than that of the second comparing end N2a.

Please refer to FIG. 3, which is circuit diagram of a prior art memory 20. For the sake of convenience, item numbers marked in FIG. 3 that are the same as those in the FIG. 1 correspond to devices or nodes having the same functionality. The most obvious difference between the memory 20 and the memory 10 is that the memory 20 utilizes an additional equalizing unit 24. Between the first comparing end N1a and the second comparing end N2a of the memory 20 there is a p-type MOS transistor Tta, an n-type MOS transistor Ttb and an inverter Ivb3. The p-type MOS transistor Tta and the n-type MOS transistor Ttb form a transmission gate, where $V_{eq0}$ controls the transmission gate with the inverter Ivb3. When the transmission gate is on, the nodes Na1 and Na3 are shorted, otherwise, they are opened.

Please refer to FIG. 4A, which is a graph of voltage versus time between the first comparing end N1a and the second comparing end N2a when the memory 20 is reading data. The X-axis of FIG. 4A is time, and the Y-axis is voltage. The curves V (N1a)L and V(N1a)H show how differing data currents result in different voltages at the first comparing end N1a. The curve V(N2b) illustrates the voltage of the second comparing end N2a. Continuing with the example depicted in FIG. 2, it is also assumed that the memory unit 11A of the memory 20 provides a data current $I_{f1}$. Differing from the memory unit 10, however, is that at the timing point ta0, when the memory 20 controls the memory unit 11A to generate the data current $I_{f1}$ and the MOS transistor Ta7 to generate the data current $I_{r1}$, the memory 20 also controls the voltage Veq0 to turn on the transmission gate in the equalizing unit 24 to short the nodes Na1 and Na3. Therefore, the voltages of the first and the second comparing ends N1a and N2a are equal, and their voltages changing at the same rate. As shown in FIG. 2, the curves V(N1b)H, V(N1b)L and V(N2b) overlap between the timing points ta0 and tb1. When the timing point tb1 is reached, the controlling voltage Veq0 changes to turn off the transmission gate, and the nodes Na1 and Na3 are no longer shorted through the equalizing unit 24; their reach their respective steady state values. At the time point tb2, the sensor unit SA1 determines the data stored in the memory unit 11A by the voltage difference between the first and the second comparing end N1a and N2a. In short, the memory 20 causes the voltages of the first and the second comparing ends N1a and N2a to be the same by controlling the equalizing unit 24. This prevents the memory unit 20 from incorrectly determining the data during the transient states.

The sensor unit SA1 of memory 20 determines the data stored in the memory unit 11A according to the steady-state-voltages of $V_{aH}$, $V_{aL}$ and the reference voltage $V_{aR}$ (please refer to FIG. 2 and FIG. 4A). As the differences between these voltages is greater, the SA1 is able to determine and read the data more clearly, and the margin for reading the data is increased as well. The steady-state-voltages $V_{aH}$ and $V_{aL}$ are affected by the following factors: inconsistencies in the semiconductor manufacturing process that makes memory units that are not perfectly identical, noise interference when a read operation is in process, and changes to electrical characteristics because of repeated programming and erasing. If these factor are taken into consideration in advance to increase the operating margin by enlarging the voltage difference between $V_{aH}$, $V_{aL}$ and $V_{aR}$, then even when the above factors occur and result in voltage-drifting between $V_{aH}$ and $V_{aL}$ during operation of the memory, the memory is still able to correctly read the data. Since the steady-state-voltages $V_{aH}$ and $V_{aL}$ are established by the data current injecting into the MOS transistor Ta1 (as shown in FIG. 1 and FIG. 3), it is possible to change the characteristics of the MOS transistor TA1 when designing the memory so as to enlarge the voltage difference between $V_{aH}$ and $V_{aL}$. Generally speaking, if the MOS transistor Ta1 has a smaller aspect ratio (W/L ratio) under the condition of a fixed data current, then the voltage difference between $V_{aH}$ and $V_{aL}$ will be larger. Please refer to FIG. 4B, which is a graph of current versus voltage between the currents of source and drain electrodes and the voltage across the MOS transistor Ta1. If MOS transistor Ta1 has a smaller aspect ratio, its current-voltage curve is as shown by IV1; if MOS transistor Ta1 has a larger aspect ratio, its current-voltage curvature is as shown in IV2. As mentioned above, the supplied current will be different if the data stored in the memory unit is different. The two currents $I_{f1}$ (H) and $I_{f1}$ (L) shown in FIG. 4B illustrate that the memory unit can provide two current levels, and when they are injected into the MOS transistor Ta1, they establish two levels of steady-state-voltages $V_{aH}$ and $V_{aL}$. As shown in the curve IV1, if the aspect ratio of the MOS transistor Ta1 is smaller, the voltage difference DV1 between the two corresponding steady-state-voltages is larger, as well as the operating margin. On the other hand, as the curve IV2 illustrates, when the aspect ratio of MOS transistor Ta1 is lower, the operating margin DV2 is narrower.

However, it is known in the prior art that decreasing the aspect ratio of the MOS transistor Ta1 also decreases the current-driving ability the MOS transistor. The period of transient states is thus lengthened. Consequently, the period from when the memory unit begins to supply data current and pulls down the voltage of the first comparing end, to the voltage reaching steady state and thus able to be read data, is increased. This decreases the efficiency data accessing. The prior art memory units 10 and 20 are all undermined by their inability to give consideration to both the operating margins and the reading speed.

SUMMARY OF INVENTION

It is therefore a primary objective of the claimed invention to provide a memory using a two-stage sensing amplifier with an additional load unit to increase the operating margin while maintain a good reading speed, enabling the memory in the claimed invention to read data both quickly and correctly.

In the prior art, to read data in the memory unit, it is required to first establish a voltage by injecting the data current generated from the memory unit into the load unit, and then the sensor unit determines the data condition according to the voltages. In the claimed invention, an enabled and a disabled load unit are added.

During the transient state of reading data from the memory unit, the load unit is enabled to enhance the current-driving ability and decrease the period of the transient state. When the transient state is finished, the load unit is disabled and a smaller aspect ratio load unit is instead used for establishing a final steady-state-voltage to achieve a better operating margin for the claimed invention.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
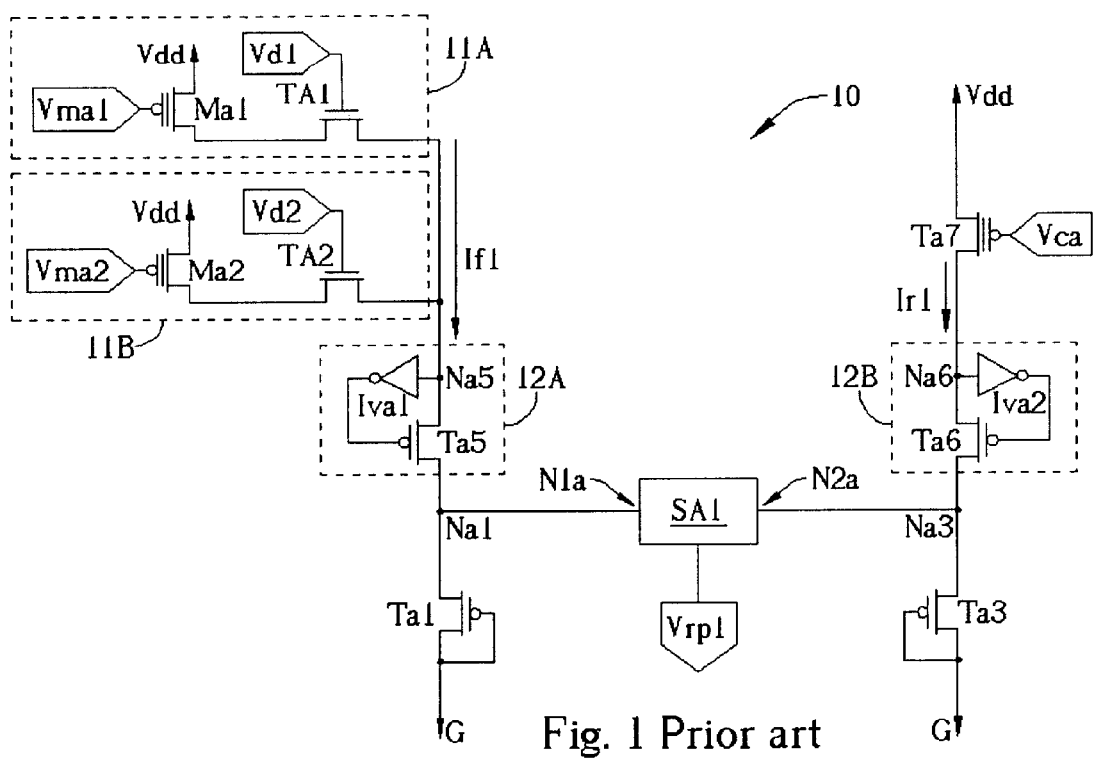
FIG. 1 is a schematic diagram of a first prior art circuitry.
Figure 2:
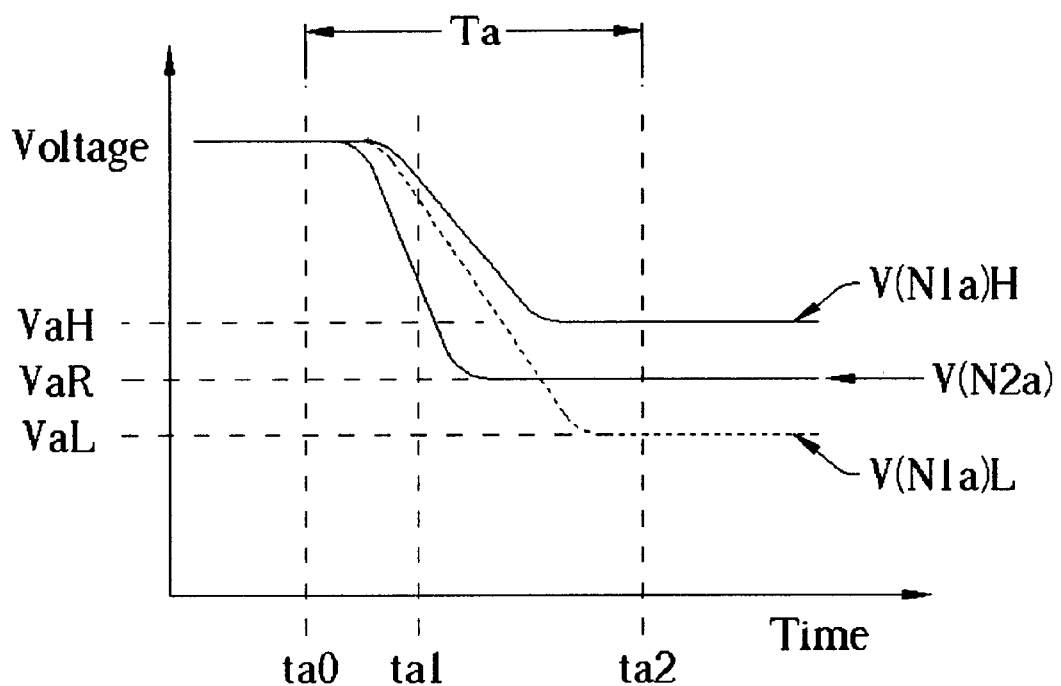
FIG. 2 is a graph of voltage versus time when the memory of FIG. 1 is reading data.
Figure 3:
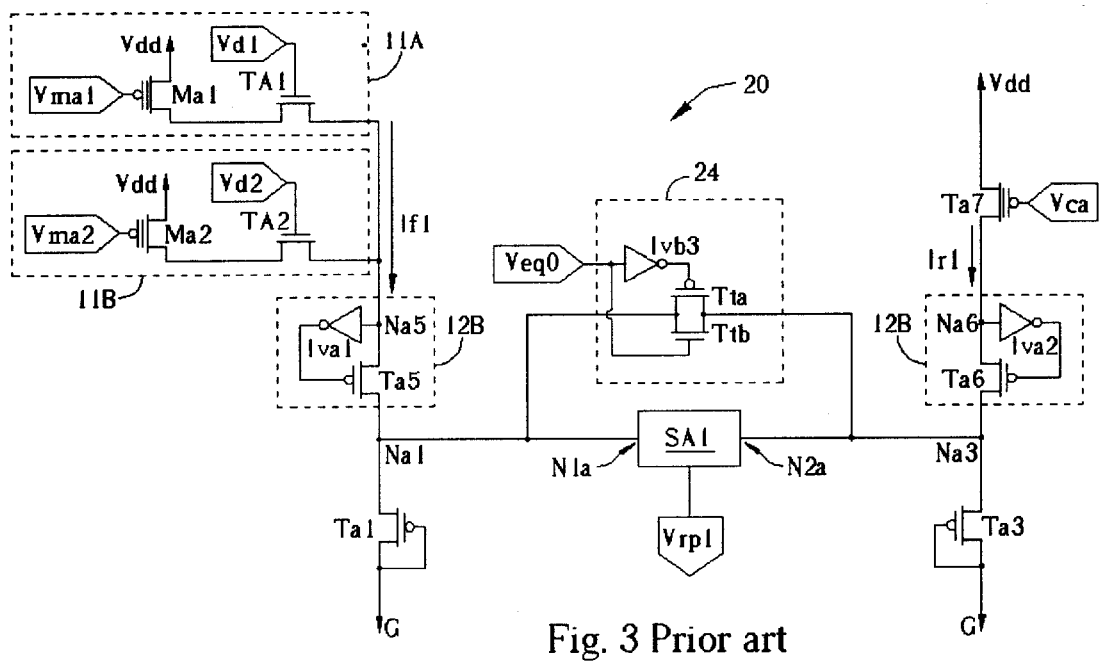
FIG. 3 is a schematic diagram of a second prior art circuit.
Figure 4A:
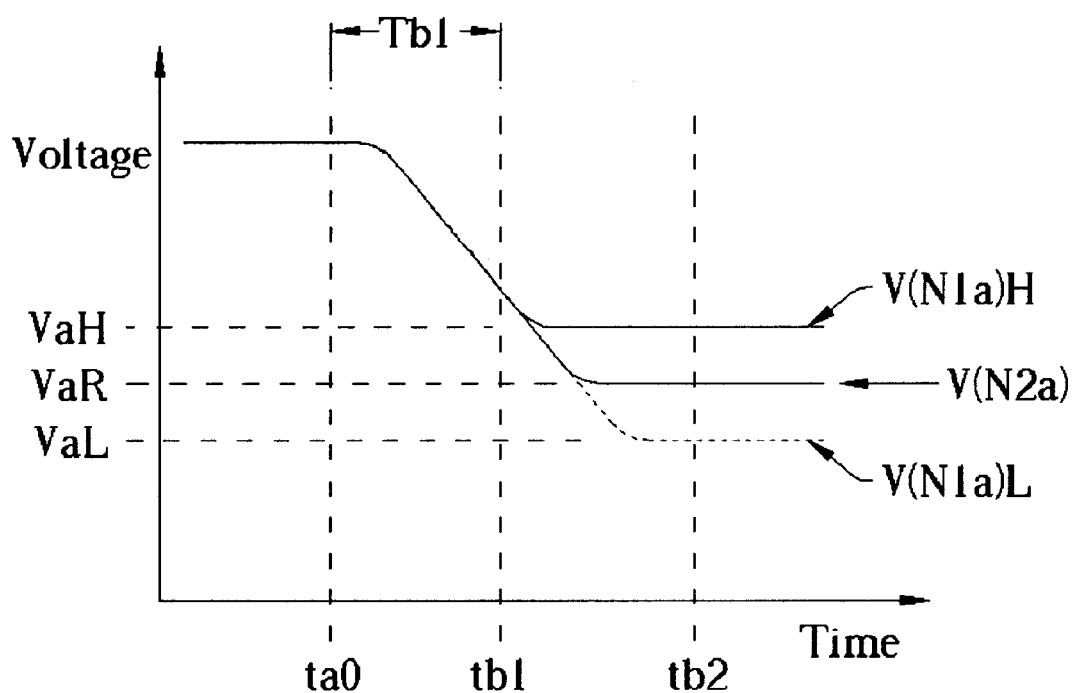
FIG. 4A is a graph of voltage versus time when the memory of FIG. 3 is reading data.
Figure 4B:
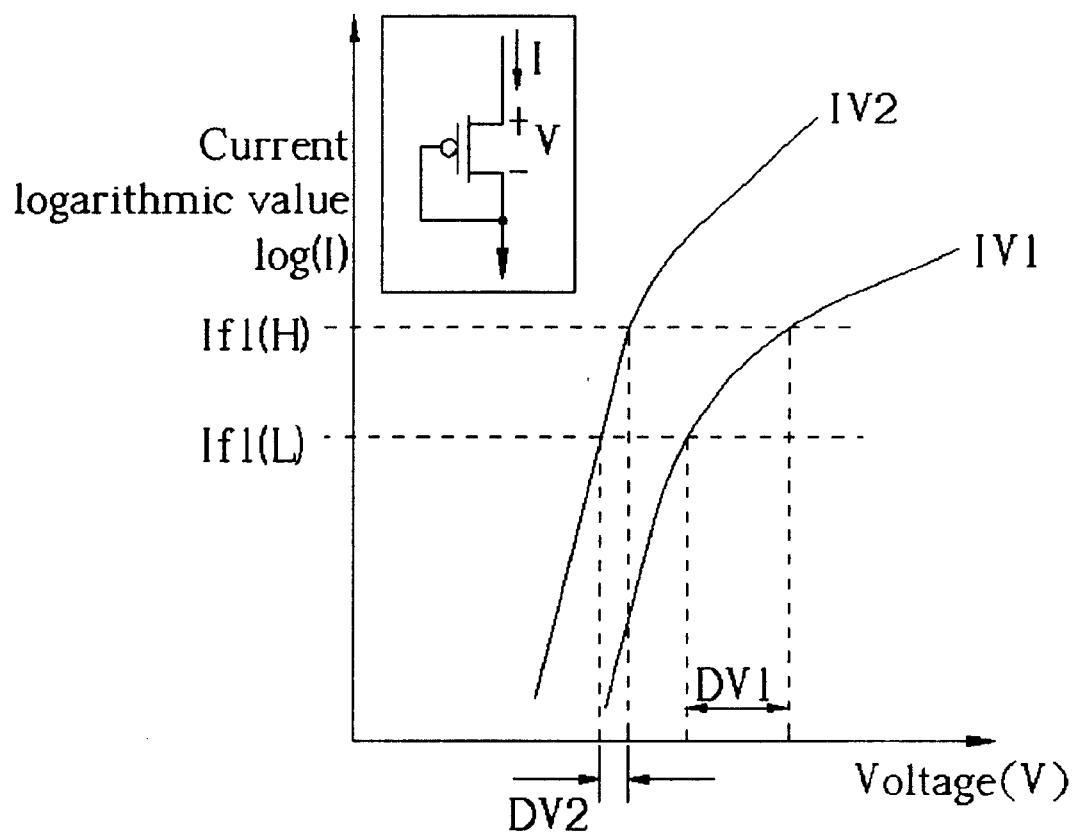
FIG. 4B is a graph of the relationship between the voltage and current of a load unit in FIG. 3.
Figure 5:
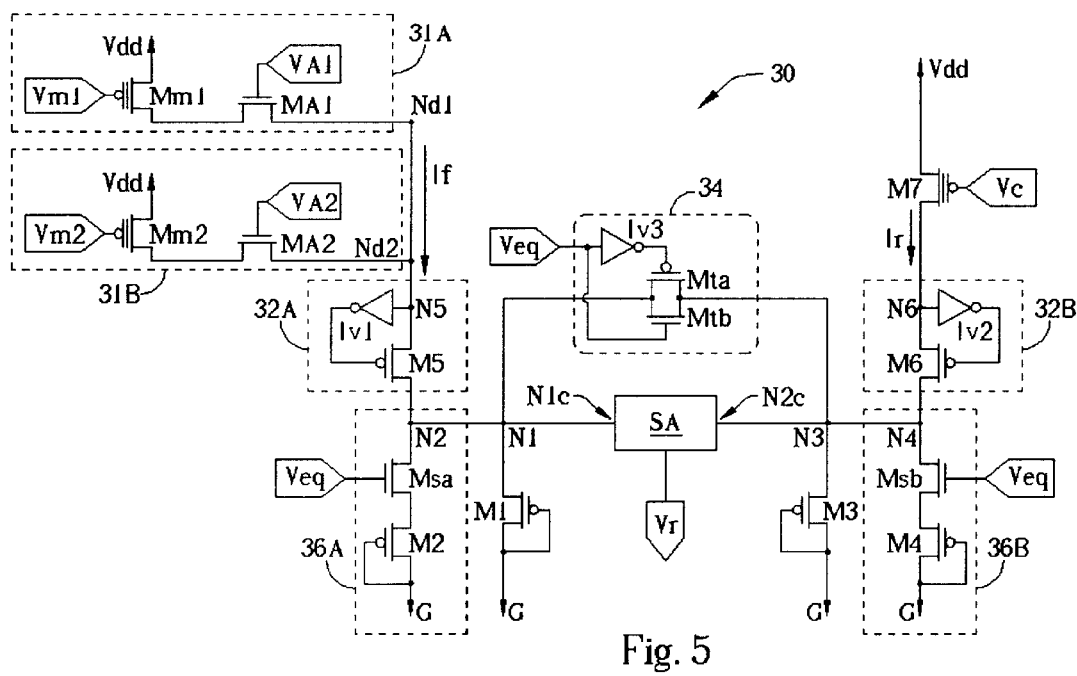
FIG. 5 is a schematic diagram of a memory circuit of the present invention.

Please refer to FIG. 5, which is a circuit schematic diagram of a memory 30 in according to the present invention. The memory 30 is DC biased by a voltage $V_{dd}$, and utilizes a plurality of memory units 31A and 31B, on-load isolation units 32A and 32B, a MOS transistor M1 as a first load unit, a second load unit 36A, a sensor unit SA, an equalizing unit 34, a MOS transistor M3 as a third load unit, a fourth load unit 36B and a MOS transistor as a reference unit M7. The memory units 31A and 31B respectively store data into the MOS transistors Mm1 and Mm2 with floating gates.

The MOS transistors MA1 and MA2 control data accessing to the memory unit 31A and 31B, respectively. The gates of the MOS transistors Mm1 and Mm2 are controlled by the voltage biases Vm1 and Vm2, respectively. The gates of the MOS transistors MA1 and MA2 are controlled by the voltage biases $V_{A1}$ and $V_{A2}$, respectively. In the memory unit 31A, the three electrodes of the MOS transistor MA1, besides the gate electrode, are connected respectively to the MOS transistor Mm1 or the outputting data current end of the memory unit 31A and connected to the node N5 through the node Nd1 and the on-load isolating unit 32A. Similarly, one of the electrodes of the MOS transistor MA2 connects to the MOS transistor Mm2 and the other connects to the output end of the memory unit 31B and the node N5 through the node Nd2. The on-load isolating units 32A and 32B respectively control the gate electrodes of the MOS transistor M5 and M6 by inverters Iv1 and Iv2. The gate of the MOS transistor M7, which serves as the reference unit, is controlled by the controlling voltage $V_c$, and one of the electrodes is connected to the power $V_{dd}$, and the other serves as a reference end, connecting to the on-load isolating unit 32B at the node N6, to output the reference current $I_r$ generated by the MOS transistor M7. The sensor unit SA is itself a differential sensor amplifier, having a first comparing end N1A and a second comparing unit N2c to generate a data signal $V_r$ according to the voltage difference between the two comparing ends. The equalizing unit 34 forms a transmission gate with two MOS transistors Mta and Mtb, and controls the transmission gate by a controlling voltage $V_{eq}$ and an inverter Iv3. When the transmission gate is on, it shorts the node N1 to the node N3. On the other hand, when the transmission gate in the equalizing unit is off, the node N1 and the node N3 are not shorted. The MOS transistor M1 serves as a first load unit, is diode-connected with two ends, with one of them connected to the sensor unit at the node N11 and the other connected to ground G. Based on a similar implementation, the MOS transistor M3 serves as the third load unit, is connected to the sensor unit SA at the node of N3 on one side, and is grounded on the other side.

The main difference between the present invention and the prior art is that in addition to the first and the third load units in the present invention, a second load unit 36A and a fourth load unit 36B are utilized in this invention. The second load unit 36A comprises MOS transistors Msa and M2. The MOS transistor Msa is a switching transistor, and the controlling voltage $V_{eq}$ controls its gate electrode as well. The other two electrodes are connected to the MOS transistor Msa and to the sensor unit SA at the node of N2. The MOS transistor M2 is diode-connected to be a load unit, and its source electrode is connected to the MOS transistor Msa. The fourth load unit 36B utilizes MOS transistors Msb and M4. The MOS transistor Msb serves as a switching transistor, with its gate electrode controlled by the controlling voltage $V_{eq}$, and the other ends connected to the diode-connected MOS transistor M4 and to the sensor unit SA at the node N4. The MOS transistor M4 is also a load unit, with its source electrode connected to the MOS transistor Msb. When the switch transistor Msa in the second load unit 36A is turned on by the controlling voltage $V_{eq}$, current is injected into the load transistor M2 through the MOS transistor Msa, and the MOS M2 establishes a voltage at the node N2. The second load unit 36A is then enabled. If the controlling voltage $V_{eq}$ turns off the switch transistor, the second load unit 36A is disabled and the node N2 isn't used for receiving current, and the node N2 shows a high-impedance characteristic. The operations of the fourth load unit 36B are similarly decided.

As in the prior art memory, the memory 30 stores electric charge corresponding to digital data in the floating gate. Under the same biases, a data current is different according to the different quantity of electric charge stored in the floating gate. According to the voltage that the data current has established on the load units, the sensor unit SA can read out the data stored in the memory unit. For example, when the memory 30 is about to read the data stored in the memory unit 31A, the memory 30 turns on the MOS transistors Mm1 and MA1 in the memory unit 31A by the controlling voltages Vm1 and VA1, respectively. The MOS transistor Mm1 generates a data current $I_f$ according to the quantity of electric charge stored in the floating gate, and the current $I_f$ is injected into the node N5 through the turned-on transistor MA1. Meanwhile, the memory 30 turns off the MOS transistor MA2 in the memory unit 31B by way of the controlling voltage $V_{A2}$, so as to prevent interference while accesses the memory unit 31A.

Figure 6:
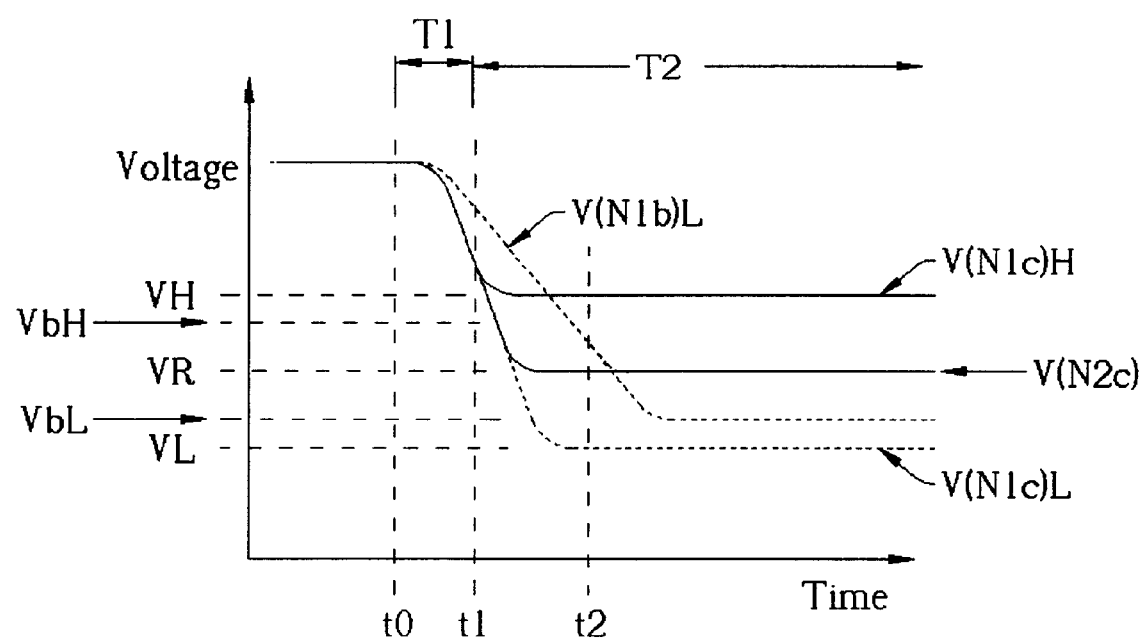
FIG. 6 is a graph of voltage versus time when the memory showed of FIG. 5 is reading data.

Please refer to FIG. 6 and FIG. 5. FIG. 6 is a graph of voltage versus time for the first comparing end N1c and the second comparing end N2c when a read operation is in process. The X-axis represents the time domain, and the Y-axis represents voltage. The curves V(N1c)H and V(N1c)L represent the voltage of the first comparing end, and the curve V(N2c) represents the voltage of the second comparing end. Before the time point t0, when the read process has not yet begun, the first and second comparing ends N1c and N2c are charged to a high voltage level. At time t0, the memory unit 31A begins to provide a data current $I_f$, and the controlling voltage $V_c$ turns on the MOS transistor M7 to provide a reference current $I_r$. At the same time, the controlling voltage $V_{eq}$ turns on the transmission gate of the equalizing unit 34, and thus shorts the node N1 and N3. The MOS transistors Msa and Msb are also controlled by the controlling voltage $V_{eq}$, and so are turned on to enable the second and the fourth on-load isolating units 36A and 38B. The controlling current flows into the load transistors M2 and M1, through the load units 32A and 32B, and through the nodes N1 and N2L. This is equivalent to adding discharging paths to accelerate the speed of lowering the voltages of the first and the second comparing ends N1c and N2c to a steady state, and the time region T1 from time point t0 to time point t1 in FIG. 6 illustrates this condition. In the time region T1, the inverters Iv1 and Iv2 of the on-load isolating units 32A and 32B change the biases of the transistors M5 and M6, which increases the equivalent impedances between the source and the drain electrodes of the two transistors MS, M6, and accelerates the transient state condition. At time point t1, the controlling voltage $V_{eq}$ changes to turn off the transmission gate of the equalizing unit 34, and the switch transistors Msa and Msb of the second and the fourth load units are simultaneously turned off to disable the two load units 36A, 36B. The data current $I_f$ is thus no longer injected into the second load unit 36A, but instead injects into the MOS transistor M1 in the first load unit and establishes a steady-state-voltage $V_H$ or $V_L$ according to the level of the data current $I_f$. Similarly, the reference current $I_r$ is stopped from injecting into the fourth load unit 36B, and instead only injects into the MOS transistor M3 in the third load unit to establish a steady-state-reference-voltage $V_R$. At the time point t2, the sensor unit SA determines the data stored into the memory unit 31A according to the voltage difference between the first comparing end N1c and the second comparing end N2c and generates a corresponding data signal $V_r$.

To sum up, the purpose of this invention is to provide two load units 36A and 36B during the transient state when reading data, and to thus shrink the time needed for transient state transitions. At the time when the steady-state is almost reached, the second and the fourth load units 36A and 38B are disabled, which then establishes a steady-state-voltage at the first comparing end N1c by way of the original load unit transistor M1. In operation, the MOS transistor M1 of this invention is a low aspect ratio transistor, and the load unit M2 is a higher aspect ratio transistor. Within the time region T1, the transistor m2 provides a lower impedance discharging path (compared to the transistor M1), and in combination with the discharging path provided by the transistor M1, makes the voltage of the first comparing end N1c decrease rapidly, and so reduces the period required for the transient state. At time point t1, time region T2 is entered in which the second load unit 36A is disabled so as to no longer drain current, and the. steady-state-voltage VH or $V_L$ is completely established by way of the transistor M1 according to the data current $I_f$. As discussed above, a transistor with a lower aspect ratio generates a larger range for the steady-state-voltage, which enlarges the operating margin. Therefore, the present invention has the advantages of both accelerating the read process, and providing better operating margins. If the load transistor M2 for the memory 30 of the present invention is the same as the load transistor Ta1 of the prior art memory 20, and similarly if the memory units and on-load isolating circuits are the same, then the curve V(N1b)L in FIG. 6 represents one of the voltage versus time curves of the first comparing end N1b of the memory 20. It is clear that the transient state period in the present invention is shorter, and that the operating margin is significantly increased.

Figure 7:
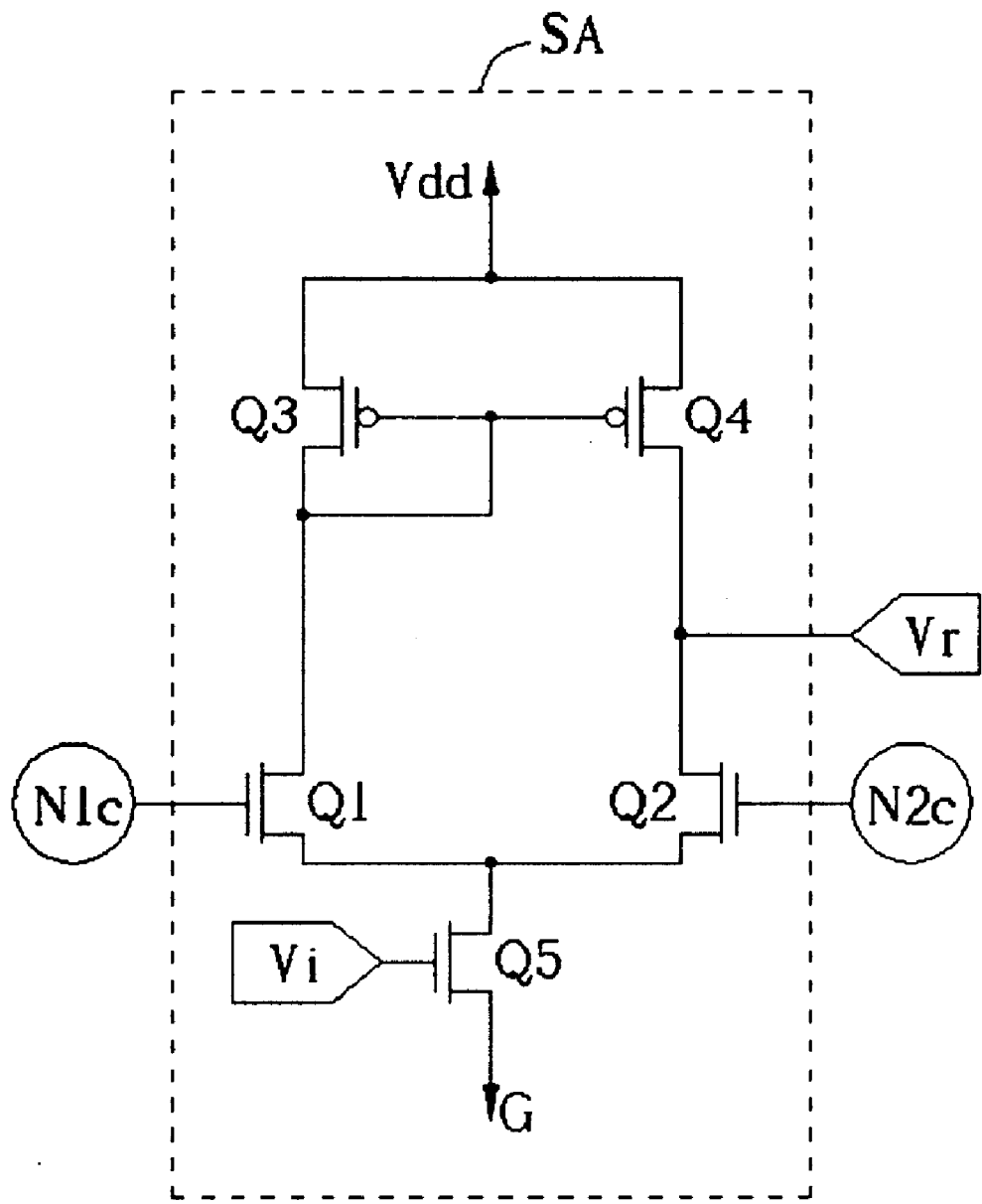
FIG. 7 is a circuit schematic diagram of a sensor unit for an operation in the present invention memory circuit.

Please refer to FIG. 7, which is a circuit schematic diagram of a sensor unit SA in the memory 30 for a read operation in the present invention. In this operation, MOS transistors Q1 and Q2 are taken as a differential output pair, MOS transistors Q3 and Q4 are dynamic loads, and the MOS transistor Q5 is a current source for bias, controlled by the controlling voltage $V_i$.

Figure 8:
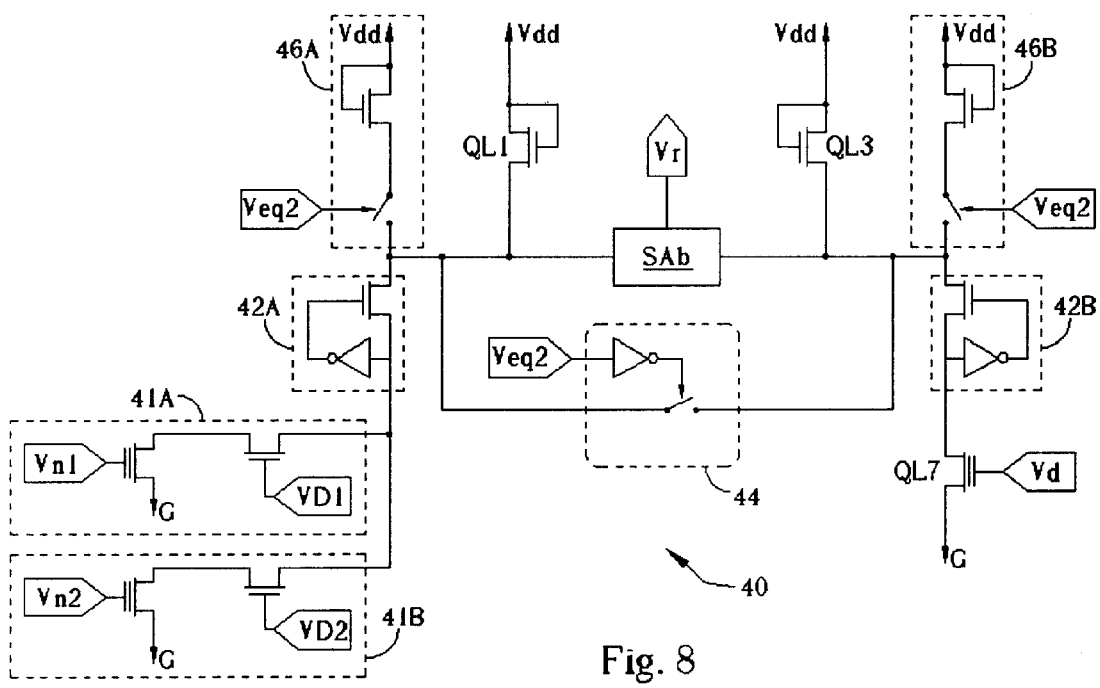
FIG. 8 is a circuit schematic diagram of a memory for an operation in the present invention.

Please refer to FIG. 8, which is a circuit schematic diagram of a memory 40 of a read operation in the present invention. Memory 40 utilizes memory units 41A and 41B, on-load isolating units 42A and 42B, an equalizing unit.44, a sensor unit SAb, MOS transistor QL1 and QL3 as a first and a third load unit, respectively; a second unit 46A; a fourth unit 46B, and a MOS transistor QL7 as a reference unit. The controlling voltage Veq2 controls the equalizing unit 44 and the second load unit 46A and the fourth load unit 46B. The main difference between the memory 30 and the memory 40 is that the memory 30 takes memory units as current sources and load units as current sinks. The memory 40 takes memory units as current sinks and load units as current sources. When the memory 40 is in the process of reading data, the memory 40 discharges the two ends of the sensor unit SAb to a low-voltage-level and charges them by the load units to a high-voltage-level. During the transient state that occurs while charging, the equalizing unit conducts so as to short the two comparing ends, and enables the second and the fourth load units to provide a low-impedance-path and so shrink the period of the transient state. Finally, the second and the fourth load units are disabled, since the equalizing unit 44 is switched off, and the load units transistors QL1 and QL3 instead establish the steady-state-voltage, allowing the sensor unit SAb to determine the data stored in the memory unit and output a corresponding data signal $V_r$. The advantages of the memory 40 are identical to those indicated in the memory 30. The spirit of the invention can be utilized in other types of non-volatile memory, or MOS devices with ONO gate electrodes. That is, all the transistors mentioned above can be other types of non-volatile memory, rather than simply transistors with floating gate electrodes. In addition, the p-type load transistors M1 to M4 can be n-type and diode-connected transistors; equally, the n-type transistors QL1 and QL3 in FIG. 8 and the load transistors of the load units 46A and 46B can be converted to p-type and diode-connected MOS devices, as shown in FIG. 5.

In the prior art memory, only one load unit is implemented to provide a discharging path, preventing the prior art from simultaneously giving consideration to both reading speed and operating margins. In contrast, the memory of the present invention dynamically enables extra load units to speed up the discharging process. When a transient state is near completion, the extra load units are disabled and a lower aspect ratio transistor takes over to serve as the load unit to achieve the steady-state-voltage. A better operating margin is thereby achieved.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A memory comprising:

at least a memory cell having a data end, the memory cell being used for storing data and for generating a data current that flows through the data end according to the data;

a sensor having a first comparing end connected to the data end, the sensor being used for generating a corresponding data signal according to a voltage difference occurring between a voltage of the first comparing end and a reference voltage;

a first load cell having a first end connected to the first comparing end, the first load cell being used for generating a voltage at the first end according to a current input through the first end; and a second load cell having a second end connected to the first comparing end, the second load cell capable of being enabled or disabled; wherein when the second load cell is enabled, the second load cell generates a corresponding voltage at the second end according to a current input through the second end so as to make any input current correspond to a distinct voltage, and when the second load cell is disabled, the second load cell stops inputting current to the second end;

wherein when the memory cell provides the data current, the second load cell is enabled first so as to make the data current be capable of flowing through the first comparing end to the first load cell and to the second load cell; when the second load cell has been enabled over a predetermined period, the second load cell is disabled so as to make the data current flow through the first load cell but to make the data current not flow through the second load cell; the sensor generates the data signal according a voltage difference occurring between a voltage of the first comparing end and the reference voltage so as to make the memory be capable of accessing a data stored in the memory cell; when the second load cell is disabled and the sensor generates the data signal due to a voltage difference occurring between the first comparing end and the reference voltage, a voltage of the second end will differ from the reference voltage.

2. The memory of claim 1 wherein the sensor further comprising a second comparing end; the memory further comprising:

a reference cell having a reference end electrically connected to the second comparing end for providing a reference current flowing via the reference end; and a third load cell having a third end electrically connected to the second comparing end for generating a voltage at the third end according to a current flowing through the third end;

wherein when the second load cell is disabled, the reference current will flow via the second comparing end to the third end of the third load cell so as to make the third load cell be capable of generating the reference voltage at the third end.

3. The memory of claim 2 further comprising an equalizing cell connected between the first comparing end and the second comparing end for not shorting the first comparing end to the second comparing end when the second load cell is disabled, but to short the first comparing end to the second comparing end when the second load cell is enabled so as to make a voltage of the first comparing end equal a voltage of the second comparing end.

4. The memory of claim 2 further comprising:

a fourth load cell having a fourth end connected to the second comparing end for generating a voltage at the fourth end according to a current flowing through the fourth end;

wherein when the second load cell is enabled, the reference current will flow through the second comparing end to the third load cell and to the fourth load cell.

5. The memory of claim 2 further comprising a load isolating cell electrically connected between the reference end and the second comparing end for transmitting the reference current from the reference end to the second comparing end.

6. The memory of claim 1 further comprising a load isolating cell electrically connected between the data end and the first comparing end for transmitting the data current from the data end to the first comparing end.

7. The memory of claim 1 wherein the memory cell comprises a metal oxide semiconductor (MOS) transistor with a floating gate or the memory cell comprises a MOS transistor with a ONO gate or the memory cell comprises a mask read-only-memory (mask ROM).

8. The memory of claim 1 wherein when a voltage at the first end of the first load cell equals a voltage at the second end of the second load cell, a current flowing through the first end of the first load cell will be less than a current flowing through the second end of the second load cell.

9. The memory of claim 1 wherein when a data stored in the memory cell is a first data, the memory cell is capable of providing a first data current, whereas when a data stored in the memory cell is a second data, the memory cell is capable of providing a second data current; a difference between a voltage provided by the first load cell after receiving the first data current and a voltage provided by the first load cell after receiving the second data current is a first voltage difference; a difference between a voltage provided by the second load cell after receiving the first data current and a voltage provided by the second load cell after receiving the second data current is a second voltage difference, which is less than the first voltage difference.

10. The memory of claim 1 wherein the second load cell comprises:

a load transistor having a source; and a switching transistor electrically connected between the source and the second end; wherein when the second load cell is enabled the switching transistor will switch on so as to make a current flowing through the second end flow through the switching transistor to the source, whereas when the second load cell is disabled the switching transistor will switch off so as to make a current flowing through the second end not flow through the switching transistor to the source.

11. A method of a memory for accessing data stored in the memory; the memory comprising:

at least a memory cell having a data end for storing a data and for providing a data current flowing via the data end corresponding to the data;

a first load cell having a first end electrically connected to the data end for generating a voltage at the first end according to a current inputting through the first end; and a second load cell having a second end connected to the first end for generating a corresponding voltage at the second end according to a current flowing through the second end when the second load cell is enabled and for stopping to input a current through the second end when the second load cell-is disabled;

the method comprising:

providing the data current to the data end by the memory cell; enabling the second load cell so as to make the data current flow to the first load cell and flow to the second load cell;

disabling the second load cell so as to make the data current flow to the first load cell but to make the data current not flow to the second load cell after the second load cell has been enabled over a predetermined period;

determining a data stored in the memory cell according to a reference voltage and to a voltage of the first end of the first load cell;

wherein when the second load cell is disabled and the sensor is determining the data stored in the memory cell according to a voltage difference between a voltage of the first end and the reference voltage, the voltage at the second end does not equal the reference voltage.

12. The method of claim 11 wherein the memory further comprises:

a reference cell having a reference end for providing a reference current flowing through the reference end; and a third load cell having a third end electrically connected to the reference end for generating a voltage at the third end according a current flowing through the third end;

wherein when the second load cell is disabled, the reference current will flow to the third end so as to make the third load cell generate the reference voltage at the third end.

13. The method of claim 12 furthering comprising:

not shorting the first end to the third end when the second load cell is disabled, but to short the first end to the third end when the second load cell is enabled so as to make a voltage at the first end equal to a voltage at the third end.

14. The method of claim 12 wherein the memory further comprises a load isolating cell electrically connected between the reference end and the third end for transmitting the reference current from the reference end to the third end.

15. The method of claim 11 wherein the memory further comprises a load isolating cell electrically connected between the data end and the first end for transmitting the data current from the data end to the first end.

16. The method of claim of 11 wherein the memory cell comprises a MOS transistor with a floating gate or the memory cell comprises a MOS transistor with a ONO gate or the memory cell comprises a mask ROM.

17. The method of claim 11 wherein when a voltage at the first end of the first load cell equals a voltage at the second end of the second load cell, a current flowing through the first end of the first load cell will be less than a current flowing the second end of the second load cell.

18. The method of claim 11 wherein when a data stored in the memory cell is a first data the memory cell will provide a first data current, when a data stored in the memory cell is a second data the memory cell will provide a second data current; a difference between a voltage provided by the first load cell after receiving the first data current and a voltage provided by the first load cell after receiving the second data current is a first voltage difference; a difference between a voltage provided by the second load cell after receiving the first data current and a voltage provided by the second load cell after receiving the second data current is a second voltage difference, which is less than the first voltage difference.

* * * * *